United States Patent
Stockman

(10) Patent No.: US 6,835,957 B2
(45) Date of Patent: Dec. 28, 2004

(54) III-NITRIDE LIGHT EMITTING DEVICE WITH P-TYPE ACTIVE LAYER

(75) Inventor: Stephen A. Stockman, Morgan Hill, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 116 days.

(21) Appl. No.: 10/209,468

(22) Filed: Jul. 30, 2002

(65) Prior Publication Data

US 2004/0021143 A1 Feb. 5, 2004

(51) Int. Cl.⁷ .............................. H01L 27/15
(52) U.S. Cl. ............................ 257/79; 257/98
(58) Field of Search .................. 257/79, 99, 98, 257/103, 96, 101, 102, 613, 201, 94, 190

(56) References Cited

U.S. PATENT DOCUMENTS

| | | | | |
|---|---|---|---|---|
| 5,656,832 A | * | 8/1997 | Ohba et al. | 257/190 |
| 5,684,309 A | * | 11/1997 | McIntosh et al. | 257/191 |
| 5,747,832 A | | 5/1998 | Nakamura et al. | 257/103 |
| 5,874,747 A | * | 2/1999 | Redwing et al. | 257/77 |
| 6,153,894 A | * | 11/2000 | Udagawa | 257/96 |
| 6,440,823 B1 | * | 8/2002 | Vaudo et al. | 438/478 |

OTHER PUBLICATIONS

Takashi Mukai et al., "InGaN–Based Blue Light–Emitting Diodes Grown on Epitaxially Laterally Overgrown GaN Substrates", Japanese Journal of Applied Physics, 1998, pp. L839–L841.

* cited by examiner

*Primary Examiner*—Long Pham
*Assistant Examiner*—Hoa B. Trinh
(74) *Attorney, Agent, or Firm*—Patent Law Group LLP; Rachel V. Leiterman

(57) ABSTRACT

A III-nitride light emitting device includes an n-type layer, a p-type layer, and an active region capable of emitting light between the p-type layer and the n-type layer. The active region includes at least one additional p-type layer. The p-type layer in the active region may be a quantum well layer or a barrier layer. In some embodiments, both the quantum well layers and the barrier layers in the active region are p-type. In some embodiments, the p-type layer in the active region has an average dislocation density less than about $5 \times 10^8$ cm$^{-2}$.

19 Claims, 4 Drawing Sheets

III-NITRIDE LIGHT EMITTING DEVICE WITH P-TYPE ACTIVE LAYER

BACKGROUND

1. Field of Invention

This invention relates to III-nitride light emitting devices with at least one p-type layer in the active region.

2. Description of Related Art

Semiconductor light-emitting devices (LEDs) are among the most efficient light sources currently available. Materials systems currently of interest in the manufacture of high-brightness LEDs capable of operation across the visible spectrum include Group III–V semiconductors, particularly binary, ternary, and quaternary alloys of gallium, aluminum, indium, and nitrogen with the general formula $Al_xIn_yGa_zN$, $0 \leq x \leq 1$, $0 \leq y \leq 1$, $0 \leq z \leq 1$, $x+y+z=1$, also referred to as III-nitride materials. Typically, III-nitride light emitting devices are fabricated by epitaxially growing a stack of semiconductor layers of different compositions and dopant concentrations on a sapphire, silicon carbide, or III-nitride substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. The active region is n-type (typically Si-doped or undoped).

SUMMARY

In accordance with embodiments of the invention, a III-nitride light emitting device includes an n-type layer, a p-type layer, and an active region capable of emitting light between the p-type layer and the n-type layer. The active region includes at least one additional p-type layer. The p-type layer in the active region may be a quantum well layer or a barrier layer. In some embodiments, both the quantum well layers and the barrier layers in the active region are p-type.

In some embodiments, the p-type layer in the active region has an average dislocation density less than about $5 \times 10^8$ cm$^{-2}$. Several methods are disclosed for fabricating p-type layers in the active region with low defect densities. First, the device layers may be fabricated on a AlInGaN substrate with low defect density. Second the device layers may be fabricated on a thick AlInGaN layer formed by hydride vapor phase epitaxy. Third, the device layers may be fabricated on an AlInGaN layer formed by epitaxial lateral overgrowth.

DETAILED DESCRIPTION

Figure 1:
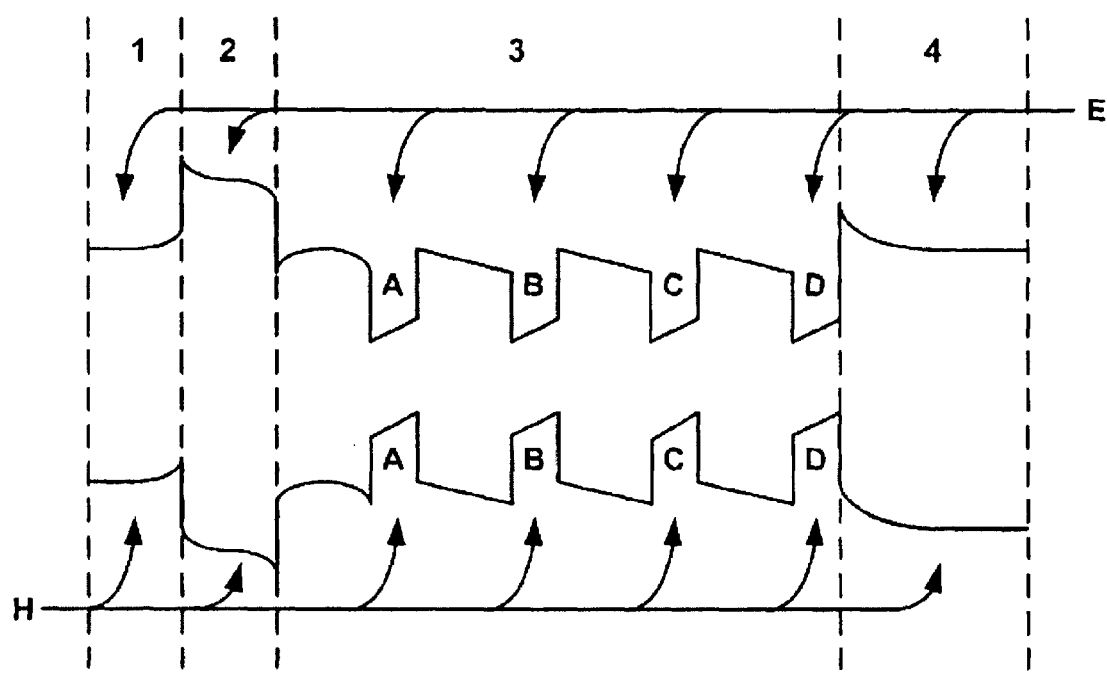
FIG. 1 illustrates an energy band diagram of a portion of a light emitting device with an n-type active region.

FIG. 1 illustrates a portion of an energy band diagram of a III-nitride light emitting device under a forward bias. FIG. 1 illustrates a p-type GaN layer 1, a p-type AlGaN cladding layer 3, an n-type active region 3, and an n-type GaN or InGaN layer 4. The active region 3 includes several quantum wells labeled A, B, C, and D, separated by barrier layers. Electrons E enter the active region from n-type layer 4 and holes H enter the active region from p-type layer 1. Electrons and holes recombine in the active region to emit light.

Figure 2:
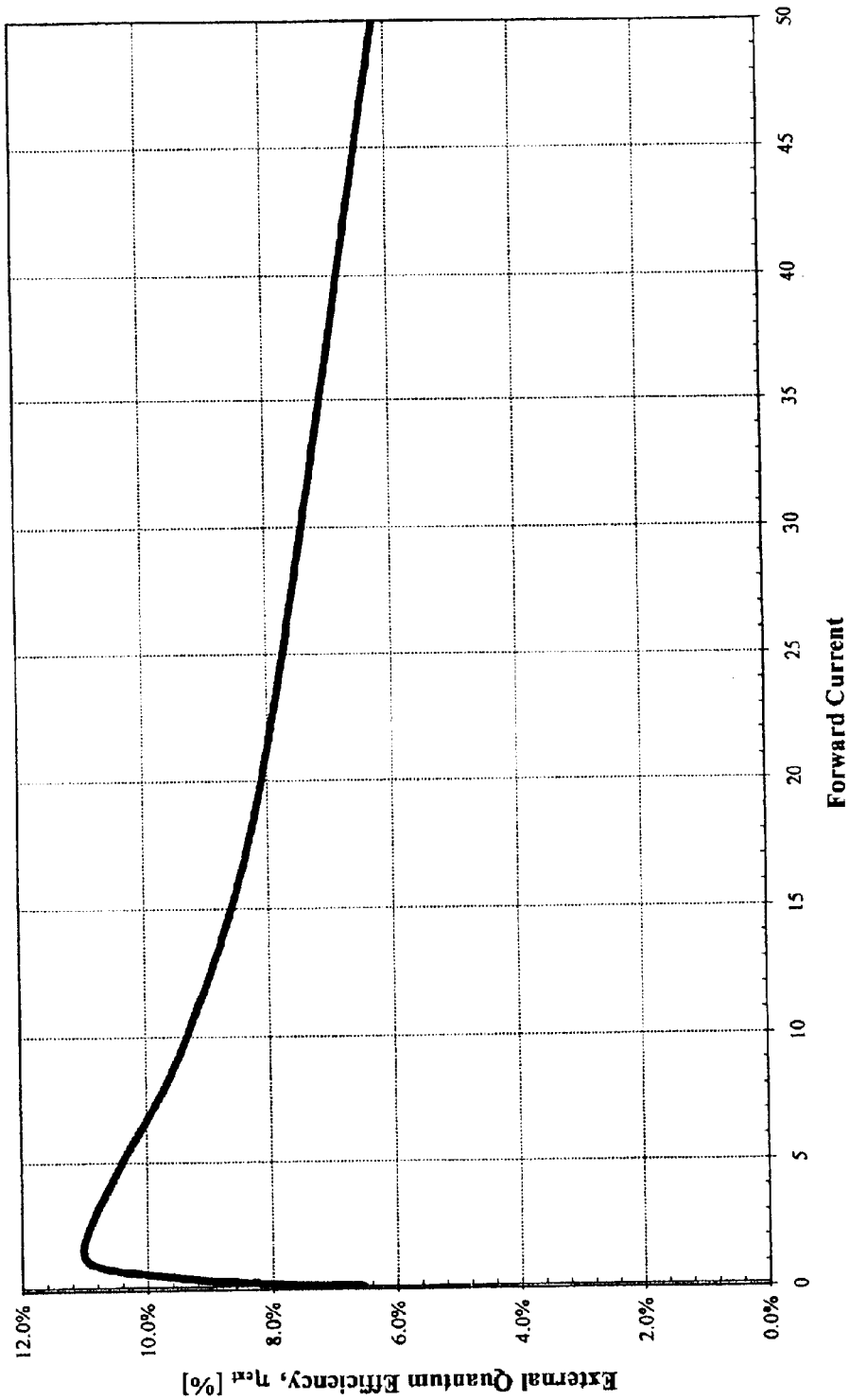
FIG. 2 is a plot of external quantum efficiency as a function of current for a III-nitride light emitting device.

At high current densities (>50 A/cm$^2$), the internal quantum efficiency of III-nitride light emitting devices with n-type or undoped active regions decreases. FIG. 2 illustrates the external quantum efficiency of a III-nitride device as a function of current. As shown in FIG. 2, the external quantum efficiency peaks at very low current, then decreases as current increases. One possible explanation is that due to the low diffusion length of holes in n-type III-nitride materials and to the barriers between quantum wells, holes will be efficiently injected into quantum well A of FIG. 1, but will be largely unable to diffuse to the "deeper" quantum wells B, C, and D. As a result, these wells will remain largely empty of holes. Since electrons are significantly more mobile than holes in III-nitride materials, electrons will congregate in areas of high hole concentration, attracted by the positive charge of the holes. As a result, the electron population in quantum well A will become excessively high at high current density, leading to state filling and causing excessive electron leakage into p-type layers 1 and 2. This leakage current is undesirable because it cannot produce light at the desired wavelength. Thus, an excess of charge carriers in quantum well A and the relative lack of charge carriers in quantum wells B–D may be a cause of the decrease in external quantum efficiency at high current illustrated in FIG. 2.

Figure 3:
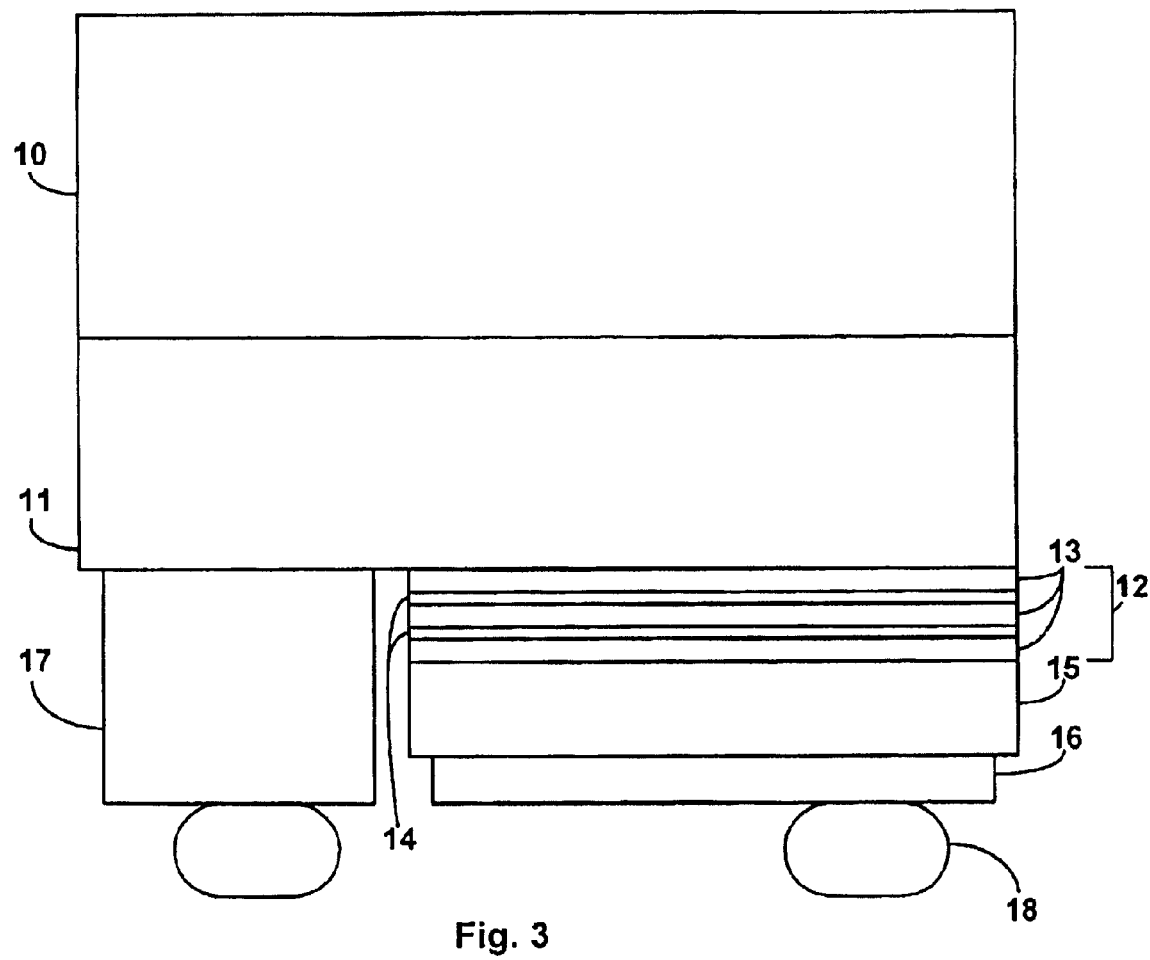
FIG. 3 illustrates a light emitting device in accordance with an embodiment of the present invention.

FIG. 3 illustrates a light emitting device according to an embodiment of the present invention. The device in FIG. 3 includes an n-type layer 11 formed on a substrate 10. N-type layer 11 may include several different sublayers, including for example, nucleation layers, buffer layers, contact layers, and undoped layers. An active region 12 is formed on n-type layer 11. Active region 12 may be a single quantum well or multiple quantum wells 14 separated by barrier layers 13. A p-type layer 15 is formed over active region 12. Like n-type layer 11, p-type layer 15 may include multiple sublayers. A portion of the semiconductor layers is etched away to reveal a ledge on one of the sublayers in n-type layer 11. An n-contact 17 is then deposited on n-type layer 11 and a p-contact 16 is deposited on p-type layer 15. The device is then flipped over and interconnects 18 are attached to contacts 16 and 17. Interconnects may be, for example, solder, and are used to connect contacts 16 and 17 to a submount (not shown). Though the device in FIG. 3 is described with the n-type layer adjacent to the substrate, the ordering of the layers may be reversed such that the p-type layer is adjacent to the substrate.

In accordance with an embodiment of the invention, at least one of the layers in active region 12 is doped p-type. The at least one p-type layer may be a quantum well layer or a barrier layer in a multiple quantum well active region. In some embodiments, both quantum well layers and barrier layers are p-doped. All the layers of a given type need not have the same doping concentration, composition, or thickness. For example, if the at least one p-type layer in the active region is a quantum well layer, the other quantum well layers in the device may have the same or different doping concentration, composition, and thickness as the p-type quantum well layer.

The p-type layer in the active region, either a quantum well layer or a barrier layer, may have a hole concentration ranging between about $10^{15}$ cm$^{-3}$ and about $10^{19}$ cm$^{-3}$, and usually has a hole concentration ranging between about $10^{16}$ cm$^{-3}$ and about $10^{18}$ cm$^{-3}$. The dopant may be any suitable p-type dopant, such as Mg, Zn, Be, Cd, or any other shallow acceptor with a binding energy less than about 300 meV. Mg is often used as a p-type dopant in III-nitride devices. If Mg is the dopant, the p-type layer in the active region may have a Mg concentration ranging between about $10^{17}$ cm$^{-3}$ and about $10^{21}$ cm$^{-3}$, and usually has a Mg concentration ranging between about $10^{18}$ cm$^{-3}$ and about $10^{20}$ cm$^{-3}$ in order to achieve the hole concentrations described above. As described above, the barriers and quantum wells need not have the same hole concentrations. Also, the hole concentrations among different quantum wells or among different barrier layers may also vary.

In some embodiments of the invention, all the layers of active region 12 are p-type. In other embodiments, the p-n junction may be located within active region 12, meaning that there may be n-type layers in the active region on the n-side of the p-n junction.

The quantum well layers in the active region may be GaN or InGaN. The In composition in the quantum well layers may range between 0% and about 30%, and usually ranges between about 5% and about 20%. The barrier layers in the active region may be GaN, InGaN, AlGaN, or AlInGaN, provided they have a bandgap larger than that of the quantum well layers. The quantum well layers generally have a thickness ranging between about 10 angstroms and about 50 angstroms. The barrier layers generally have a thickness ranging between about 10 angstroms and about 300 angstroms.

In some embodiments, cladding layers may be formed on one or both sides of the active region. The cladding layers may be, for example, AlGaN, GaN, or AlInGaN with a wider bandgap than the quantum well layers. These cladding layers may be considered to be part of n-type layer 11 and p-type layer 15.

The diffusivity of electrons in III-nitride semiconductors is greater than that of holes. As a result, the diffusion length of electrons in p-type material is much longer than the diffusion length of holes in n-type materials. In addition, holes are readily available in a p-type active region. Thus, in a p-type multiple quantum well active region, electrons and holes will be distributed more evenly among the quantum wells, rather than concentrating mainly in the quantum well which is nearest the p-n junction, as in the case of an n-type active region. Also, in a device with a p-type active region, the location of the p-n junction is less critical than the location of the p-n junction in a device with an n-type active region. In an n-type active region, the location of the p-n junction must be closely controlled such that the distance between the p-n junction and the quantum wells is shorter than the diffusion length of the holes in the n-type active region. Since electrons can readily move in a p-type active region and holes are readily available, the placement of the p-n junction relative to the quantum wells is less critical.

Conventional III-nitride light emitting devices are fabricated with n-type active regions because p-type quantum wells tend to emit little or no light when optically or electrically pumped. An n-type active region can be formed from intentional Si-doping, or can also be a result of growth of undoped GaN or InGaN, which inherently shows n-type conductivity due to residual impurities and native defects that act as shallow donors. One likely explanation for efficient radiative recombination in n-type III-nitrides is that the diffusion length of holes in n-type III-nitride material is much shorter than typical dislocation spacing. Dislocations within crystalline III-nitride materials decrease the internal quantum efficiency of quantum wells by robbing the quantum wells of charge carriers through nonradiative recombination. The dislocation spacing corresponding to several dislocation densities is given below:

| Dislocation Density | Average Dislocation Spacing |
|---|---|
| $10^{10}$ cm$^{-2}$ | 0.1 µm |
| $10^{9}$ cm$^{-2}$ | 0.3 µm |
| $10^{8}$ cm$^{-2}$ | 1 µm |
| $10^{7}$ cm$^{-2}$ | 3 µm |
| $10^{6}$ cm$^{-2}$ | 10 µm |

Commercial light emitting devices fabricated on sapphire or SiC substrates may have a dislocation density ranging between about $5 \times 10^{8}$ m$^{-2}$ and about $10^{10}$ cm$^{-2}$. In GaN, the diffusion length of holes in n-type material is believed to be about 0.05 µm. Thus, though dislocations in an n-type active region can result in nonradiative recombination, they do not have an appreciable impact on the internal quantum efficiency of the device because most holes cannot diffuse far enough laterally to reach a dislocation. In fact, it has been reported by Mukai, et al. (Jpn. J. Appl. Phys. Vol. 37, pp. L839–841, 1998), that reducing the average dislocation density of a GaN-based LED with an undoped active layer from $10^{10}$ cm$^{-2}$ to $7 \times 10^{6}$ cm$^{-2}$ has no effect on InGaN LED efficiency.

The diffusion length of an electron in p-type GaN is close to or greater than 1 µm, much greater than the diffusion length of a hole in n-type GaN. In a device with a p-type active layer and a dislocation density ranging between about $5 \times 10^{8}$ cm$^{-2}$ and about $10^{10}$ cm$^{-2}$ the diffusion length of the electrons would be much greater than the average dislocation spacing, enabling many electrons to nonradiatively recombine with a hole at a dislocation. This is the main reason why efficient III-nitride light emitting devices with a p-type active layer have not been reported, and why all known commercial devices have an n-type (Si-doped or undoped) active layer. Reducing the dislocation density of the active region such that the average dislocation spacing is less than the diffusion length of an electron in the active region may increase the internal quantum efficiency of a device with a p-type active region. For example, blue light emitting devices with n-type active regions may have an output power of 10 mW or more at 470 nm at a drive current of 20 mA. Devices with p-type active regions have demonstrated an output power of less than 1 mW. Embodiments of the present invention may allow p-type active region devices with output power much greater than 1 mW, without the problem of decreased efficiency at high current density shown in FIG. 2. Assuming a diffusion length of greater than 1 µm, reducing the average dislocation density to about $10^{8}$ cm$^{-2}$ or less should suffice to make a p-type active region emit light efficiently. Further reducing the average dislocation density to $10^{7}$ cm$^{-2}$ or less would result in higher radiative efficiency.

In some embodiments, a light emitting device with at least one p-type layer in the active region is fabricated such that the active region has a dislocation density of about $5 \times 10^{8}$ cm$^{-2}$ or less. There are several ways to reduce the dislocation density in the active region. First, the device may be fabricated on a substrate of bulk single crystal GaN, where average dislocation densities of $10^{4}$ cm$^{-2}$ to $10^{6}$ cm$^{-2}$ have been reported. Second, the device may be fabricated on a thick GaN layer (>5 microns) formed by hydride vapor phase epitaxy. Third, the device may be fabricated on a low defect density GaN layer formed by epitaxial lateral overgrowth (ELOG) or any related technique which involves lateral growth over a mask or void. During ELOG growth, pockets of GaN are grown on a conventional substrate, such as sapphire. A mask is deposited on the substrate prior to growth, such that the GaN grows vertically in unmasked areas in the shape of a tower or pyramid. GaN is then grown in a lateral direction over the mask. Since the crystal is grown laterally, many of the defects in the unmasked area caused by growth on a lattice-mismatched substrate are not propagated into the lateral growth areas, yielding areas of sufficiently low defect density ($<\sim 10^7$ cm$^{-2}$) for a p-type active region.

Though light emitting devices made from other materials systems use p-type active regions, such as III-phosphide light emitting devices, these other materials systems do not have the same problems with high defect density. For example, III-phosphide devices may be grown on substrates that are closely matched to the semiconductor device layers, resulting in devices with very low defect densities compared to III-nitride devices.

Figure 4:
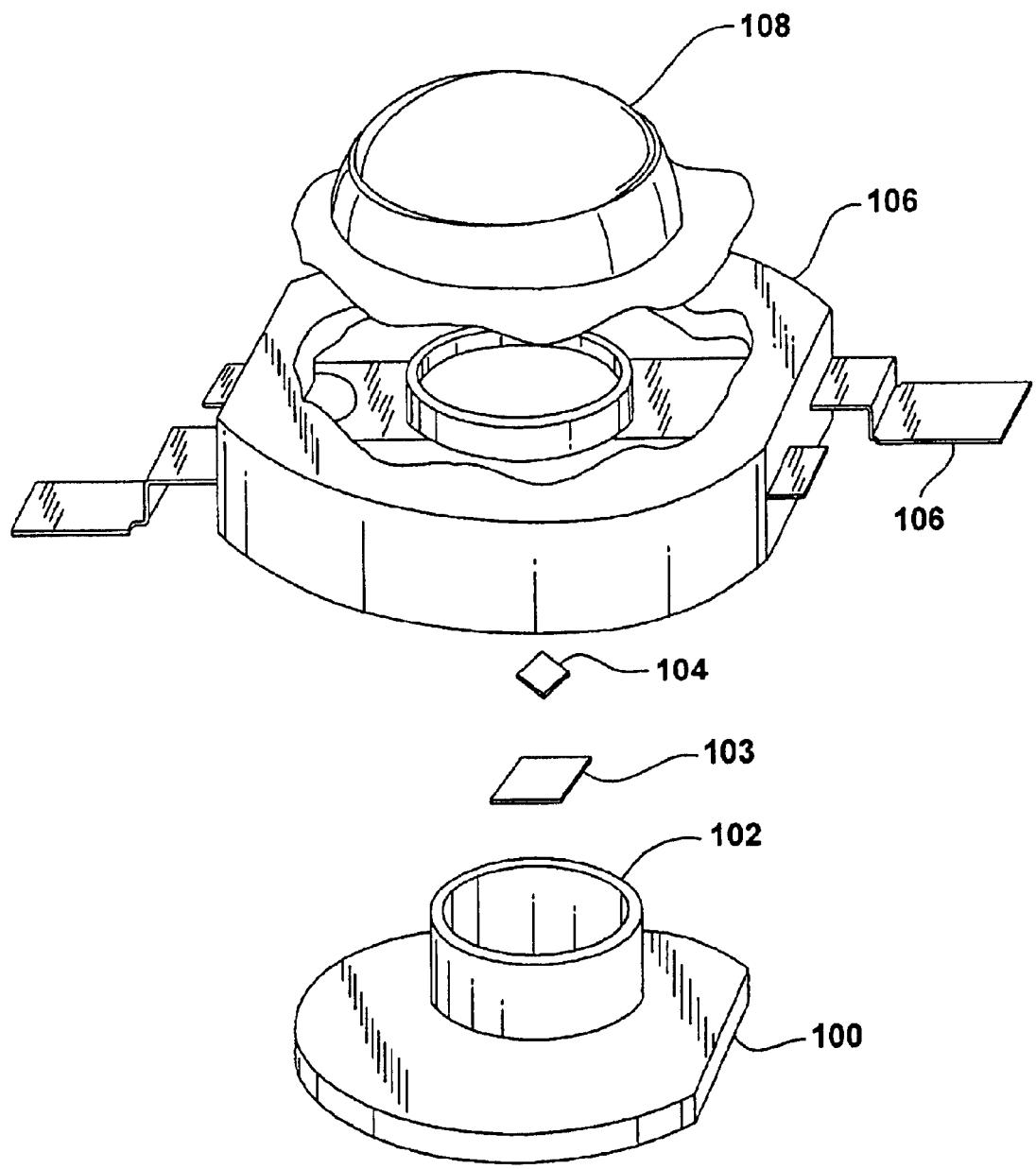
FIG. 4 illustrates a packaged light emitting device.

FIG. 4 is an exploded view of a packaged light emitting device. A heat-sinking slug 100 is placed into an insert-molded leadframe 106. Slug 100 may include an optional reflector cup 102. The light emitting device die 104, which may be any of the devices described above, is mounted directly or indirectly via a thermally conducting submount 103 to slug 100. An optical lens 108 may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A III-nitride light emitting device comprising:
   an n-type layer;
   a first p-type layer; and
   an active region capable of emitting light, the active region being disposed between the n-type layer and the p-type layer, the active region comprising at least a second p-type layer, the second p-type layer having an average dislocation density less than about $5 \times 10^8$ cm$^{-2}$.

2. The light emitting device of claim 1 wherein the second p-type layer comprises $Al_xIn_yGa_zN$, where $0 \leq x \leq 1$, $0 \leq y \leq 1$, $0 \leq z \leq 1$, $x+y+z=1$.

3. The light emitting device of claim 1 wherein:
   the active region comprises a plurality of quantum wells separated by at least one barrier layer; and
   the second p-type layer includes at least one quantum well.

4. The light emitting device of claim 1 wherein:
   the active region comprises a plurality of quantum wells separated by at least one barrier layer; and
   the second p-type layer includes at least one barrier layer.

5. The light emitting device of claim 1 wherein the average dislocation density in the second p-type layer is less than about $10^8$ cm$^{-2}$.

6. The light emitting device of claim 1 wherein the average dislocation density in the second p-type layer is less than about $10^7$ cm$^{-2}$.

7. The light emitting device of claim 1 wherein the second p-type layer has a hole concentration between about $10^{15}$ cm$^{-3}$ and about $10^{19}$ cm$^{-3}$.

8. The light emitting device of claim 1 wherein the second p-type layer has a hole concentration between about $10^{16}$ cm$^{-3}$ and about $10^{18}$ cm$^{-3}$.

9. The light emitting device of claim 1 wherein the second p-type layer is doped with Mg to a concentration between about $10^{17}$ cm$^{-3}$ and about $10^{21}$ cm$^{-3}$.

10. The light emitting device of claim 1 wherein the second p-type layer is doped with Mg to a concentration between about $10^{18}$ cm$^{-3}$ and about $10^{20}$ cm$^{-3}$.

11. The light emitting device of claim 1 wherein:
    the active region comprises a plurality of quantum wells separated by at least one barrier layer;
    the plurality of quantum well layers are $Al_xIn_yGa_zN$, where $0 \leq y \leq 0.3$; and
    the plurality of quantum well layers have a thickness ranging between about 10 angstroms and about 50 angstroms.

12. The light emitting device of claim 11 wherein:
    the barrier layer has an In composition less than the In composition in the quantum well layers; and
    the barrier layer has a thickness ranging between about 10 angstroms and about 300 angstroms.

13. The light emitting device of claim 1 wherein:
    the active region comprises a plurality of quantum wells separated by at least one barrier layer; and
    each of the quantum well layers and the at least one barrier layer are p-type.

14. The light emitting device of claim 1 further comprising a growth substrate comprising GaN.

15. The light emitting device of claim 1 further comprising:
    a first contact connected to the n-type layer;
    a second contact connected to the p-type layer.

16. The light emitting device of claim 15 further comprising:
    a first lead electrically connected to the first contact;
    a second lead electrically connected to the second contact; and
    a lens overlying the active region.

17. The light emitting device of claim 15 wherein the first contact and the second contact are formed on a same side of the device.

18. The light emitting device of claim 15 wherein the first contact and the second contact are formed on opposite sides of the device.

19. The light emitting device of claim 1 wherein:
    the active region comprises a plurality of quantum wells separated by at least one barrier layer; and
    each of the quantum well layers has a band gap smaller than a band gap of the at least one barrier layer.

* * * * *